United States Patent
Calero et al.

(10) Patent No.: US 8,410,785 B2
(45) Date of Patent: Apr. 2, 2013

(54) ELECTRICAL POWER SYSTEM PHASE AND GROUND PROTECTION USING AN ADAPTIVE QUADRILATERAL CHARACTERISTICS

(75) Inventors: Jorge Fernando Calero, Coral Springs, FL (US); Armando Guzman-Casillas, Pullman, WA (US); Gabriel Benmouyal, Boucherville (CA)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 281 days.

(21) Appl. No.: 12/885,433

(22) Filed: Sep. 17, 2010

(65) Prior Publication Data
US 2011/0068803 A1    Mar. 24, 2011

Related U.S. Application Data

(60) Provisional application No. 61/243,834, filed on Sep. 18, 2009.

(51) Int. Cl.
*G01R 31/14* (2006.01)
(52) U.S. Cl. .................................. 324/511; 324/76.11
(58) Field of Classification Search .................. 324/509, 324/511, 521–524; 361/42, 80, 79; 702/58, 702/59
See application file for complete search history.

(56) References Cited

U.S. PATENT DOCUMENTS

| | | | |
|---|---|---|---|
| 4,342,064 A * | 7/1982 | Wilkinson | ........................ 361/80 |
| 5,140,492 A | 8/1992 | Schweitzer, III | |
| 5,796,258 A | 8/1998 | Yang | |
| 6,239,959 B1 | 5/2001 | Alexander | |
| 6,434,715 B1 | 8/2002 | Andersen | |
| 6,601,001 B1 * | 7/2003 | Moore | ........................... 702/59 |
| 6,662,124 B2 | 12/2003 | Schweitzer, III | |
| 6,845,333 B2 | 1/2005 | Anderson | |
| 2007/0086134 A1 | 4/2007 | Zweigle | |
| 2008/0239602 A1 | 10/2008 | Kasztenny | |

OTHER PUBLICATIONS

Armando Guzman, Joe Mooney, Gabriel Benmouyal, Normann Fischer, Transmission Line Protection System for Increasing Power System Requirements Apr. 8, 2002.

Fernando Calero, Distance Elements: Linking Theory with Testing, Oct. 21, 2008.

E O. Schweitzer, III, Jeff Roberts, Distance Relay Element Design, Apr. 1993.

Gabriel Benmouyal, Jeff Roberts, Superimposed Quantities: Their True Nature and Application in Relays, Oct. 1999.

(Continued)

*Primary Examiner* — Vincent Q Nguyen
(74) *Attorney, Agent, or Firm* — Stoel Rives LLP

(57) ABSTRACT

A quadrilateral distance module may be used to detect faults in an electrical power system. A resistive coverage of the quadrilateral distance module may be defined by an adaptive resistance blinder. The adaptive resistance blinder may be adapted to certain power system conditions, such as forward load flow and/or reverse load flow. A forward adaptive resistance blinder may be calculated in parallel with a reverse adaptive resistance blinder. The forward adaptive resistance blinder may use a polarizing quantity adapted for forward load flow conditions, and the reverse adaptive resistance blinder may use a polarizing quantity adapted for reverse load flow conditions. Fault detection may be performed by comparing both the forward and reverse adaptive resistance blinders to power system stimulus and detecting a fault when the stimulus satisfy either blinder.

14 Claims, 9 Drawing Sheets

OTHER PUBLICATIONS

Solveig Ward, Comparison of Quadrilateral and Mho Distance Characteristic, Oct. 26, 1999.

Jeff Roberts, Edmund O. Schweitzer, III, Renu Aurora, Ernie Poggi, Limits to the Sensitivity of Ground Directional and Distance Protection, May 15, 1997.

PCT/US2010/049409 International Search Report and Written Opinion of the International Searching Authority, Nov. 9, 2010.

Fernando Calero, Armando Guzman, Gabriel Benmouyal, Adaptive Phase and Ground Quadrilateral Distance Elements, Dec. 14, 2009.

James Hubertus, Joe Mooney, George Alexander, Application Considerations for Distance Relays on Impedance-Grounded Systems, Sep. 12, 2007.

Joe Mooney, Jackie Peer, Application Guidelines for Ground Fault Protection, 1997.

\* cited by examiner

ELECTRICAL POWER SYSTEM PHASE AND GROUND PROTECTION USING AN ADAPTIVE QUADRILATERAL CHARACTERISTICS

CROSS-REFERENCE TO RELATED APPLICATIONS

This Application claims priority to U.S. Provisional Application No. 61/243,834, filed Sep. 18, 2009 and entitled, "Electrical Power System Phase and Ground Protection Using Quadrilateral Distance Elements," which is hereby incorporated by reference in its entirety.

TECHNICAL FIELD

This disclosure relates to power system protection and, more particularly, to a quadrilateral distance module incorporating an adaptive resistance blinder.

BRIEF DESCRIPTION OF THE DRAWINGS

Non-limiting and non-exhaustive embodiments of the disclosure are described, including various embodiments of the disclosure with reference to the figures, in which.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

An IED, such as a protective relay, may monitor and protect an electrical power system in the event of power system faults. As used herein, the term IED may refer to any device that monitors, controls, automates, and/or protects monitored equipment within the power system. Typically, such IEDs are implemented and/or comprise a computing device that includes a processor, memory, machine-readable non-transitory storage media, input/output interfaces, and the like. IEDs are, for example, differential relays, distance relays, directional relays, feeder relays, overcurrent relays, voltage regulator controls, voltage relays, breaker failure relays, generator relays, motor relays, automation controllers, remote terminal units, bay controllers, meters, recloser controls, communications processors, computing platforms, programmable logic controllers (PLCs), programmable automation controllers (PALs), input and output modules, and the like. The term IED may be used interchangeably to describe an individual IED or a system comprising multiple IEDs.

Figure 1:
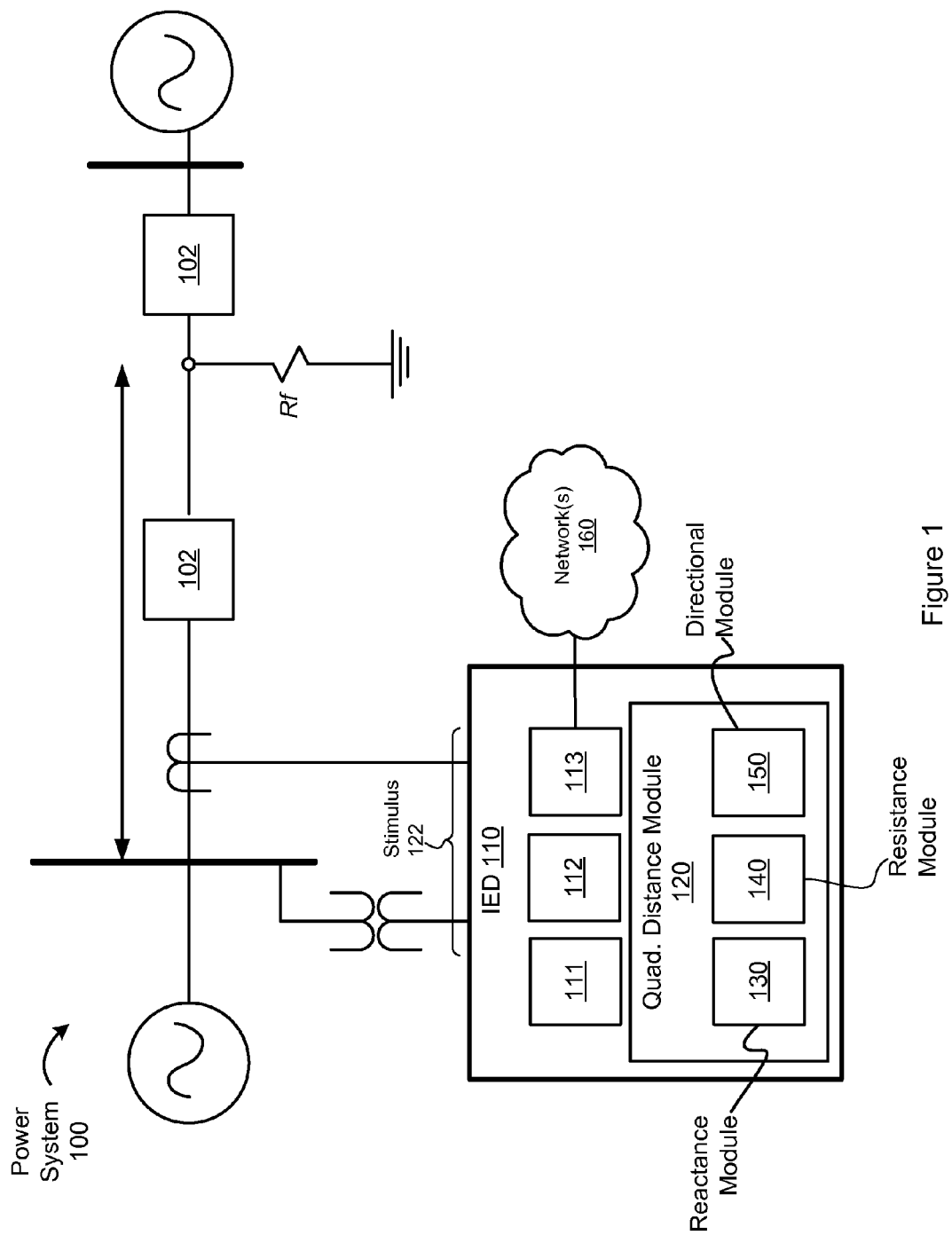
FIG. 1 depicts an electrical power system comprising an IED implementing a quadrilateral distance module.

FIG. 1 depicts one example of a power system 100 comprising an IED 110, which may be configured to monitor and/or protect the power system 100. As discussed above, the IED 110 may comprise and/or be implemented in conjunction with a computing device. Accordingly, the IED 110 may include a processor 111, which may comprise one or more general purpose processors, special purposes processors, application-specific integrated circuits, programmable logic elements (e.g., FPGAs), or the like. The IED 110 may further comprise non-transitory machine-readable storage media 112, which may include one or more disks, solid-state storage (e.g., Flash memory), optical media, or the like. The IED 110 may be communicatively coupled to one or more networks 160 using via one or more communication interfaces 113. The networks 160 may include special-purpose networks for monitoring and/or controlling the electrical power system 100 (e.g., SCADA networks, or the like). The networks 160 may further include general purpose communication networks, such as a TCP/IP network, or the like. The communication interface 113 may include wired and/or wireless communication interfaces (e.g., serial ports, RJ-45, IEEE 802.11 wireless network transceivers, etc.). In some embodiments, the IED 110 may include human-machine interface (HMI) components (not shown), such as a display, input devices, and so on.

Components of the IED 110, such as the quadrilateral distance module 120, reactance module 130, resistance module 140, and/or directional module 150 (described below) may be implemented using components of the IED 110. For example, the modules 120, 130, 140, and/or 150 may be implemented (in part) using instructions stored on the non-transitory machine-readable storage medium 112, which may be operable on the processor 111. Alternatively, or in addition, portions of the components 120, 130, 140, and/or 150 may be implemented using dedicated hardware modules (e.g., circuit components).

The IED 110 may be communicatively coupled to the power system 100 through one or more current transformers, voltage measurement devices, the communication interface 113, or the like. The IED 110 may receive stimulus 122 from the power system 100. The stimulus 122 may be received via the measurement devices described above and/or via the communication interface 113 (e.g., from another IED or other monitoring device (not shown) in the electrical power system 100). The stimulus 122 may include, but is not limited to: current measurements, voltage measurements, and the like. The stimulus 122 may comprise phasor measurements (e.g., measurements comprising a magnitude and angle).

The IED 110 may comprise and/or implement a quadrilateral distance module 120 configured to detect fault conditions using an impedance function (e.g., comparing power system 100 impedance levels to a quadrilateral characteristic). The quadrilateral distance module 120 may comprise a reactance module 130, resistance module 140, and/or a directional module 150. The reactance module 130 and resistance module 140 may define one or more quadrilateral characteristics (e.g., quadrilateral characteristic 200 of FIG. 2A), to which stimulus received from the power system 100 may be compared. When the power system 100 stimulus satisfy operating conditions of the quadrilateral distance module 120 (e.g., fall within an operating region of one or more of the quadrilateral characteristics), the quadrilateral distance module 120 (and/or IED 110) may detect a fault condition and may operate (e.g., trip one or more breakers 102, operate one or more switches, assert one or more alarms, issue one or more notifications, or the like).

The reactance module 130 may determine an impedance coverage of the quadrilateral distance module 120, whereas the resistance module 140 may determine the resistive coverage (e.g., resistance coverage may determine the Rf that can be detected). The reactance module 130 may be adaptive to address overreach due to fault resistance (Rf) and/or load flow conditions (e.g., forward load flow, reverse load flow, etc.). The resistance module 140 may generate adaptive resistance blinders to detect as much Rf as possible.

As discussed below, adaptation of a reactance element (generated by the reactance module 130) may comprise "tilting" the adaptive reactance element with respect to impedance (e.g., modifying the impedance coverage of the quadrilateral characteristic). Adaptation of a resistance blinder calculated by the resistance module 140 may comprise tiling the resistance blinder with respect to the resistance axis using a polarizing quantity (e.g. negative sequence-polarization, I1+I2 polarization, or another polarizing quantity). The tilt may change the resistive coverage of the quadrilateral characteristic, which may provide additional Rf coverage. In some embodiments, a quadrilateral characteristic may comprise a plurality of adaptive resistance blinders operating in parallel; a forward adaptive resistance blinder (using negative sequence polarization or the like) may provide improved resistance coverage in forward load flow conditions, whereas a reverse adaptive resistance blinder (using I1+I2 polarization or the like) may provide improved resistance coverage in reverse load flow conditions.

Figure 2A:
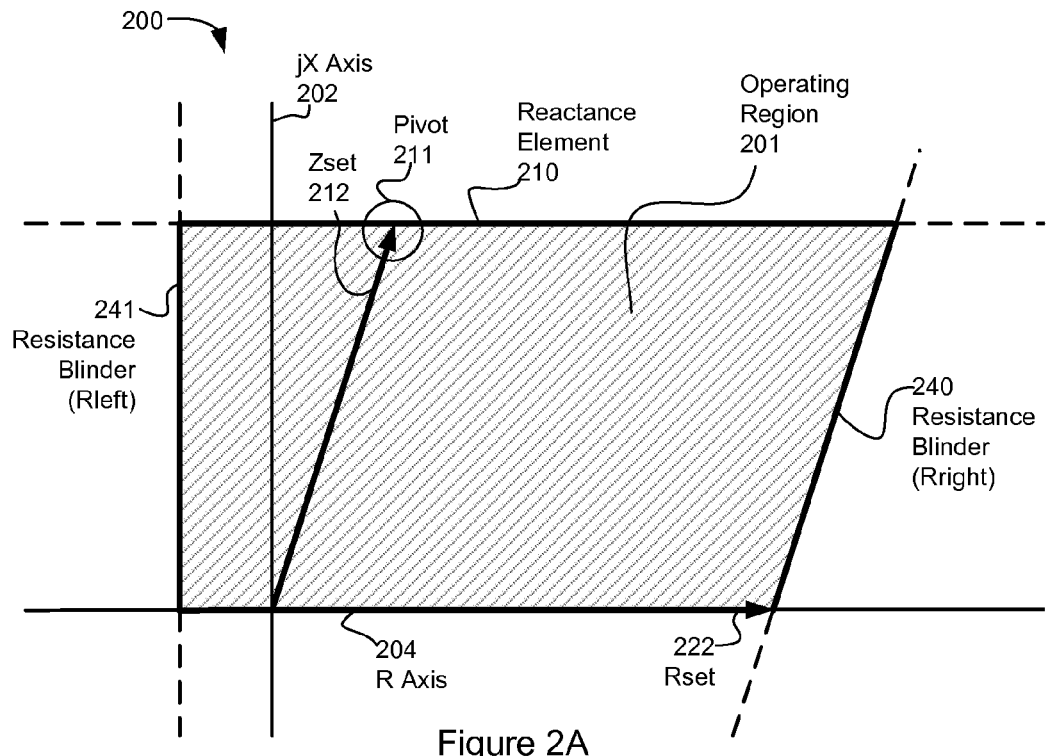
FIG. 2A depicts an example of a quadrilateral characteristic.

FIG. 2A depicts one example of a quadrilateral characteristic 200. The quadrilateral characteristic may be implemented by an IED and/or quadrilateral distance module, such as the IED 110 and quadrilateral distance module 120 of FIG. 1.

The quadrilateral characteristic 200 may define an operating region 201 to which power system stimulus may be compared. A quadrilateral distance module implementing the characteristic 200 may operate when power system stimulus satisfy the quadrilateral characteristic 200 (e.g., impedance falls within the operating region 201).

The impedance coverage of the operating region 201 along the line impedance defined by the reactance element 210. The Applicants have determined (by testing and experience) that certain power system conditions, such as forward load flow, reverse load flow, and/or Rf may cause misoperation. For example, an external fault with high levels of Rf may enter the operating area 201. Accordingly, in some embodiments, the characteristic 200 may comprise an adaptive reactance element 230 (as depicted in FIGS. 2B and 2D-2E).

Figure 2B:
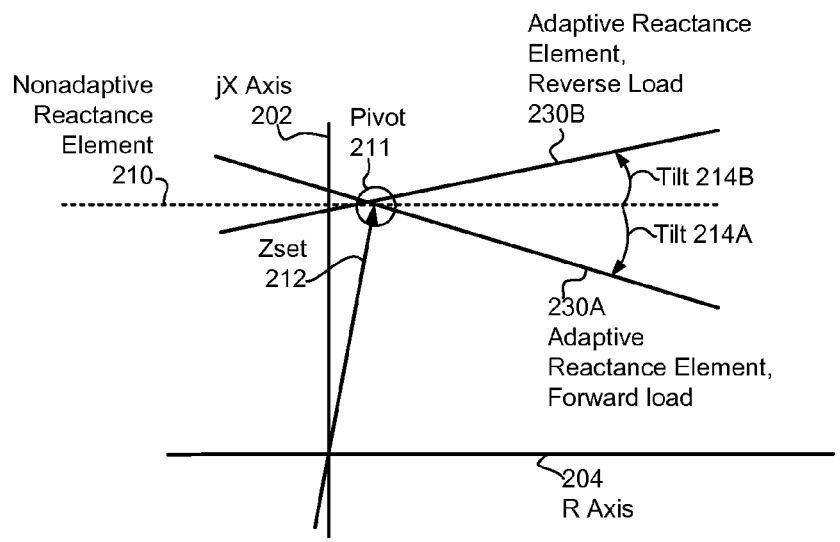
FIG. 2B depicts an example of an adaptive reactance element.

Referring to FIG. 2B, an adaptive reactance element (shown as 230A and 230B) may be configured to "tilt" with respect to the line impedance. The tilt may be a fixed element tilt, a prefault load, or the like. In some embodiments, the reactance element 230 may be tilted using a polarizing quantity, which may be derived from a negative-sequence current, or other polarizing quantity (e.g., I1+I2 polarization, etc.) Negative-sequence current may be suitable as a polarizing quantity due to the homogeneity of the negative-sequence network.

The adaptive reactance element 230 (shown as 230A and 230B) may pivot about a pivot point 211, which may be defined by an impedance setting (Zset) 212. The impedance setting 212 may be derived from properties and/or characteristics of the power system, such as line impedance and the like, and may be selected according to testing and/or experience.

FIG. 2B depicts examples of adaptive reactance elements 230A and 230B that are tilted about the pivot 211 of the impedance setting Zset 212. The tilt 214A and/or 214B may be determined using a polarizing quantity (e.g., negative-sequence polarization, I1+I2 polarization, or the like), which may adapt the reactance element 230A and/or 230B for forward and/or reverse load flow conditions. The adaptive reactance element 230A is adapted by tilt 214A for a forward load flow condition, and the adaptive reactance element 230B is adapted by tilt 214B for a reverse load flow condition. As shown in FIG. 2B, the adaptive reactance elements 230A and/or 230B may modify the operating region 201 of the quadrilateral characteristic 200 depicted in FIG. 2A.

Figure 3A:
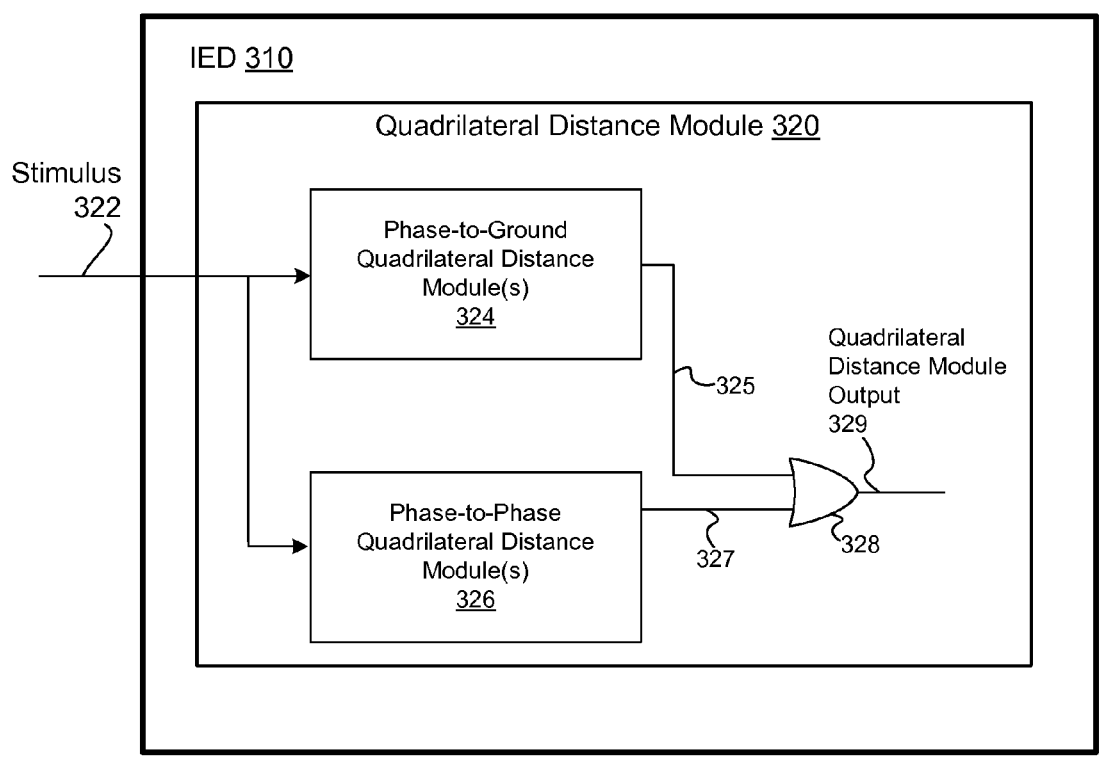
FIG. 3A depicts an embodiment of an IED comprising a quadrilateral distance module.
Figure 3B:
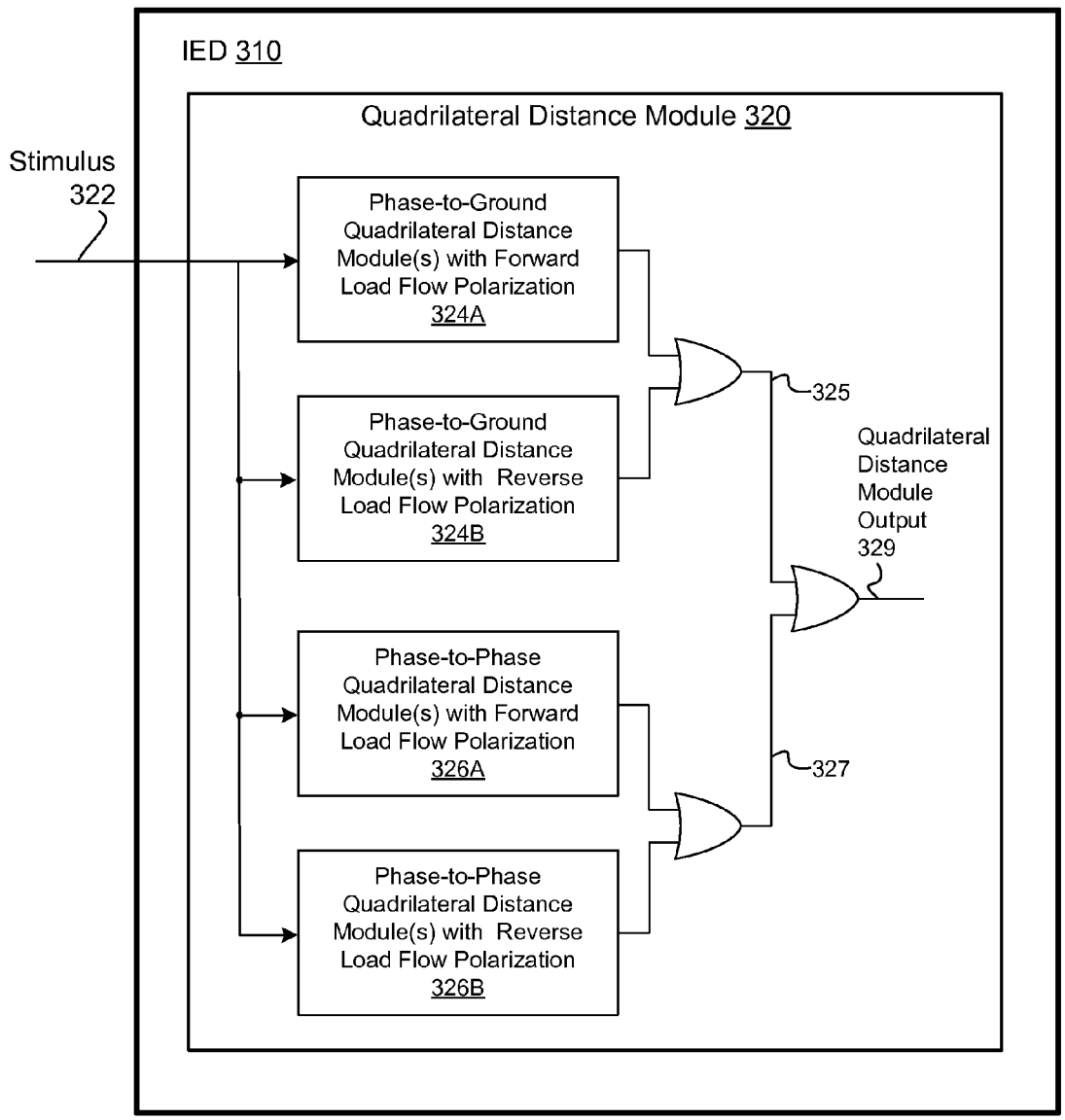
FIG. 3B depicts an embodiment of an IED comprising a quadrilateral distance module.

In some embodiments, an adaptive reactance element may be derived from an operating quantity and a polarizing quantity. In multi-phase systems (e.g., three-phase systems), the operating and polarizing quantities may be calculated on a per-phase basis as discussed below in conjunction with Equations 1-5. In some embodiments, a quadrilateral distance module (e.g., module 120) may comprise a phase-to-ground quadrilateral distance module operating in parallel with a phase-to-phase quadrilateral distance module (e.g., as depicted in FIGS. 3A and 3B). Accordingly, the reactance module 130 may be configured to generate adaptive reactance elements for a phase-to-ground module (ground adaptive reactance elements) and adaptive reactance elements for a phase-to-phase module (phase adaptive reactance elements).

The operating quantity for an A-phase-to-ground adaptive reactance element (SX1_AG) may be calculated per Equation 1:

$$SX1\_AG = VA - Zset \cdot (IA + k0 \cdot 3 \cdot I0) \quad \text{Eq. 1}$$

In Equation 1, VA is an A-phase voltage, IA is an A-phase current, k0 is a zero-sequence compensating factor, and I0 is a zero-sequence current. The zero-sequence compensating factor k0 may be derived from line impedance quantities per Equation 2:

$$k0 = \frac{Z_{L0} - Z_{L1}}{3 \cdot Z_{L1}} \quad \text{Eq. 2}$$

The polarizing quantity for the A-phase-to-ground reactance element (SX2_AG) may be calculated per Equation 2:

$$SX2\_AG = j \cdot (IA2) e^{jT} \quad \text{Eq. 3}$$

In Equation 3, IA2 is an A-phase negative-sequence current, and T refers to a reactance of the power system (e.g., derived from line reactance and set by testing and/or experience). Although Equation 3 uses a negative-sequence polarizing quantity (I2), other polarizing quantities may be used under the teachings of this disclosure. For example, Equation 3 could be adapted to use zero-sequence current (I0), or the like.

As would be recognized by one of skill in the art, Equations 1-3 could be adapted to calculate phase-to-ground adaptive reactance elements for the B and/or C phases (e.g., SX1_BG, SX2_BG, SX1_CG, and/or SX2_CG).

Figure 3C:
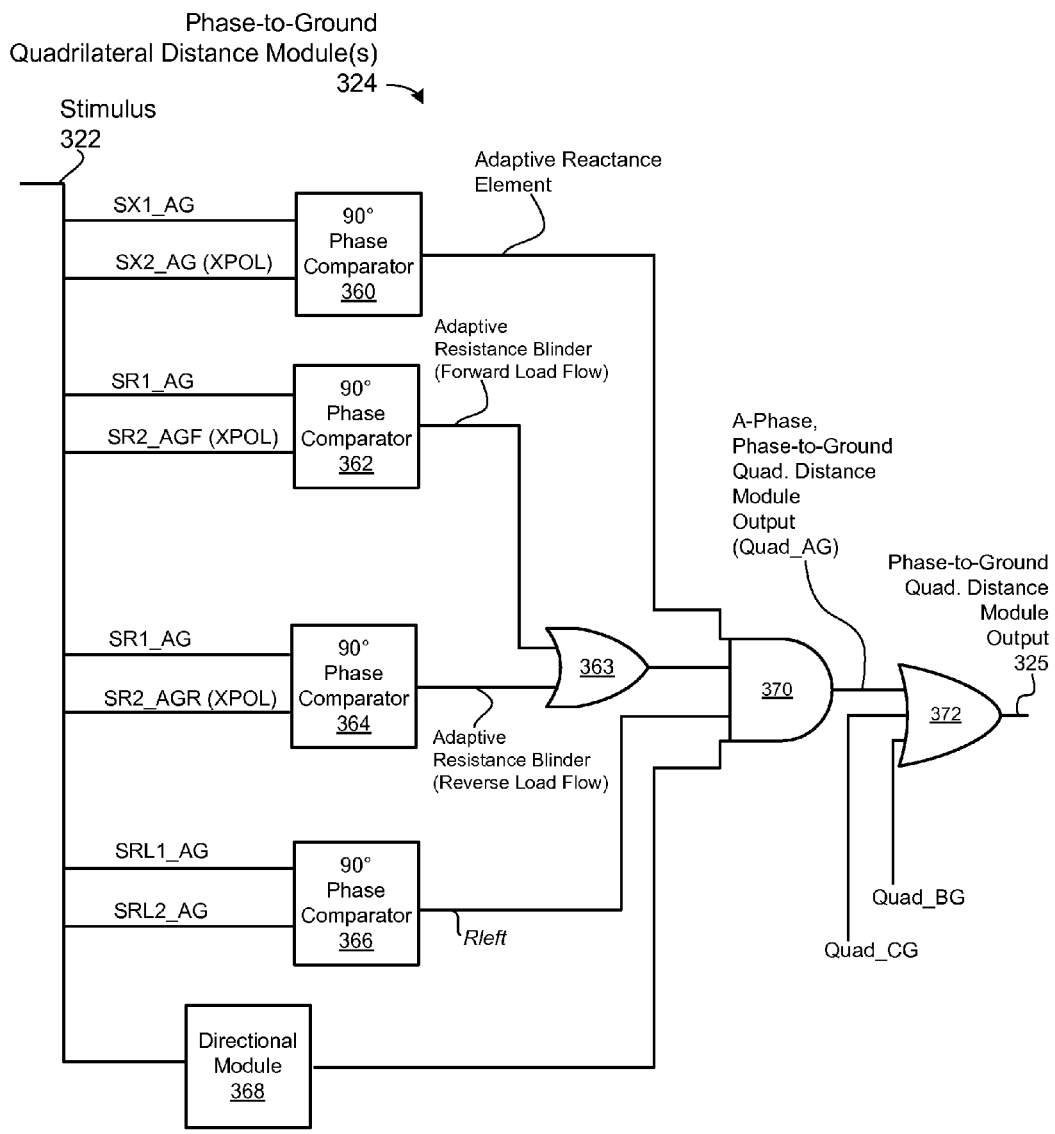
FIG. 3C depicts one embodiment a phase-to-ground quadrilateral distance module.
Figure 3D:
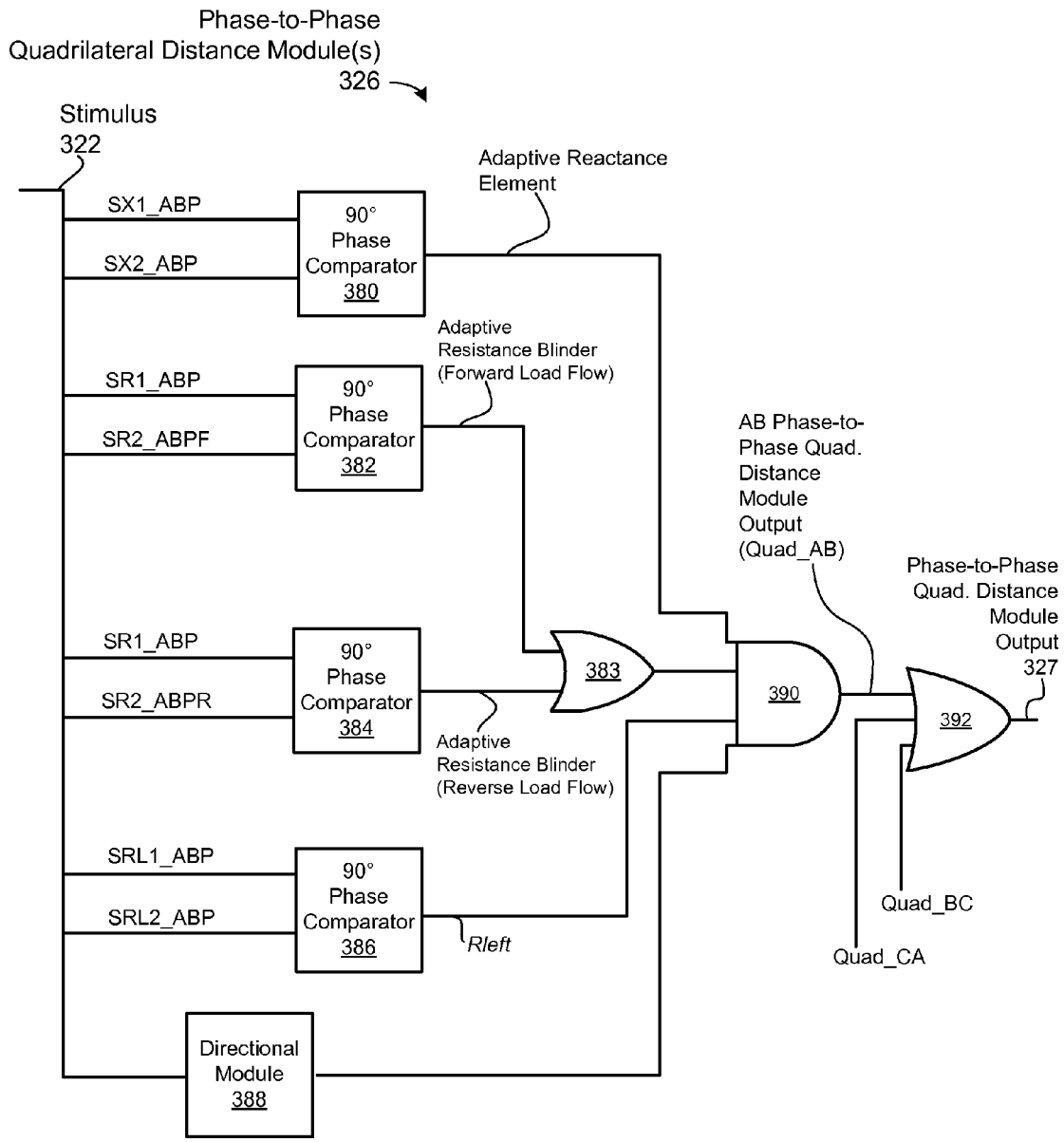
FIG. 3D depicts one embodiment of a phase-to-phase quadrilateral distance module.

Respective operating and polarizing quantities may be combined to form a ground adaptive reactance element; the combination may be implemented using various techniques, such as a phase comparator (e.g., a 90° phase comparator as depicted in FIGS. 3C and 3D), or the like.

Although Equation 3 is implemented using a polarizing quantity derived from negative-sequence currents, other polarizing quantities could be used. For example, Equation 3 may be adapted to use zero-sequence currents (I0) under certain conditions (e.g., when reliable negative-sequence current is not available).

Separate adaptive reactance elements for a phase-to-phase quadrilateral distance module may be calculated in parallel with the phase-to-ground adaptive reactance elements described above. In some embodiments, a phase adaptive reactance element for an A-phase-to-B-phase module may be calculated using an A-phase-to-B-phase operating quantity (SX1_ABP) and an A-phase-to-B-phase polarizing quantity (SX1_ABP) per Equations 4 and 5:

$$SX1\_ABP=(VA-VB)-Zset \cdot (IA-IB) \qquad \text{Eq. 4}$$

$$SX2\_ABP=j \cdot (IA2-IB2)e^{jT} \qquad \text{Eq. 5}$$

In Equations 4 and 5, IA2 is an A-phase negative-sequence current, and IB2 is a B-phase negative-sequence current. As in Equation 3, the polarizing quantity of Equation 5 is derived from negative-sequence quantities. However, other polarizing quantities, such as positive-sequence currents could be used.

The quantities SX1_ABP and SX2_ABP may be combined (using phase comparator, or the like) to yield an A-phase-to-B-phase adaptive reactance element. Equations 4-5 may be adapted to calculate adaptive phase-to-phase reactance elements for other phases (e.g., B-phase-to-C-phase, C-phase-to-A-phase, and so on).

As depicted in FIG. 2A, the resistive coverage of the quadrilateral characteristic 200 may be defined by resistance blinders 240 and 241 along the resistance axis 204 (right resistance blinder Rright 240 and left resistance blinder Rleft 241). The right resistance blinder Rright 240 may be defined (in part) by a resistance setting Rset 222, which may be derived from power system properties, such as line resistance and the like and/or may be selected according to testing and/or experience.

Figure 2C:
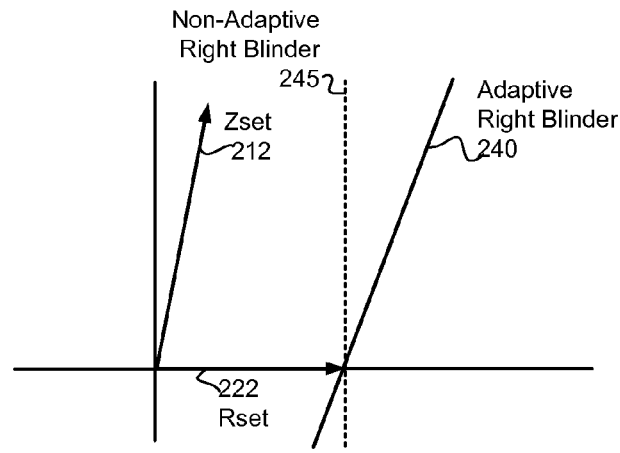
FIG. 2C depicts an example of an adaptive resistance blinder.
Figure 2D:
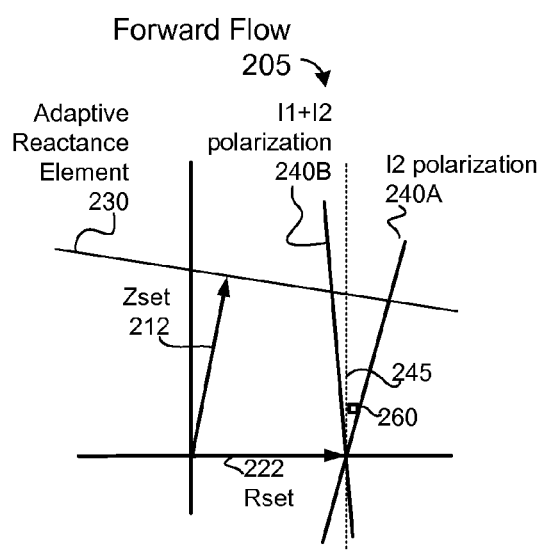
FIG. 2D depicts an example of an adaptive reactance element and adaptive resistance blinders under forward load flow conditions.
Figure 2E:
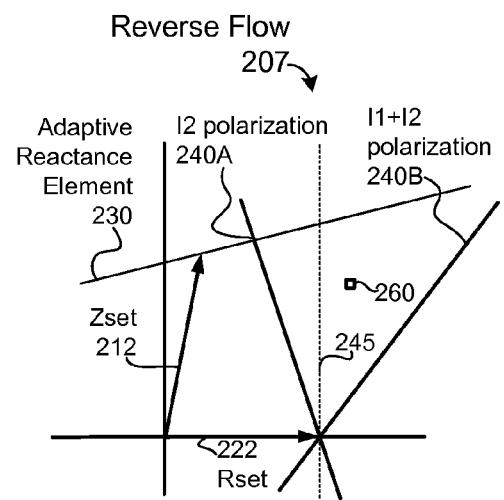
FIG. 2E depicts an example of an adaptive reactance element and adaptive resistance blinders under reverse load flow conditions.

The resistance blinders 240 and/or 241 may be static or adaptive. In the FIG. 2A example, the right resistance blinder Rright 240 may be adaptive to accommodate and detect as much Rf as possible. Accordingly, the polarizing quantity of the blinder may be shifted by θL1−90° where θL1 is angle of the positive-sequence line impedance. As depicted in FIGS. 2C-E, the adaptive tilt of the resistance blinder 240 may accommodate faults with significant fault resistance Rf and/or forward and/or reverse load flow conditions (as opposed to the non-adaptive right blinder 245, which exhibits no shift).

Under forward load flow conditions, polarization of Rright 240 using a negative-sequence current may provide increased resistive coverage; whereas, under reverse load flow conditions, other types of polarization (e.g., I1+I2 polarization) may provide superior resistance coverage.

FIG. 2D depicts an adaptive reactance element 230, an adaptive resistance blinder with negative-sequence polarization 240A, and an adaptive resistance blinder with I1+I2 polarization 240B for a fault occurring in a forward load flow condition 205. As shown in FIG. 2D, the adaptive blinder with negative-sequence polarization 240A provides additional Rf coverage (e.g., right tilt) to accommodate high fault Rf. Accordingly, the fault impedance (denoted as impedance 260) falls within the resistance blinder 240A. Conversely, the adaptive blinder with I1+I2 polarization 240B reduces resistive coverage (e.g., is tilted to the left, providing less coverage than the static blinder 245). As shown in FIG. 2D, the fault impedance 260 does not fall within the resistive coverage of either the adaptive resistance blinder with I1+I2 polarization 240B or the static blinder 245.

The converse may occur when the load flow direction is reversed. FIG. 2E depicts the adaptive reactance element 230, the adaptive resistance blinder with negative-sequence polarization 240A, and the adaptive resistance blinder with I1+I2 polarization 240B for a fault occurring in a reverse load flow condition 207. As shown in FIG. 2E, the adaptive blinder with I1+I2 polarization 240B provides the desired resistance coverage (e.g., right tilt) to accommodate the fault Rf; the fault impedance 260 falls within the resistance blinder 240B. Conversely, the adaptive resistance blinder with negative-sequence polarization 240A is tilted to the left, reducing resistive coverage. As shown in FIG. 2E, the fault impedance 260 does not fall within the resistive coverage of either the adaptive resistance blinder with negative-sequence polarization 240A or the static blinder 245.

In some embodiments, the resistance module (e.g., module 140 of FIG. 1) may be configured to generate a plurality of adaptive resistance blinders 240 in parallel (for both phase-to-ground and/or phase-to-phase modules). The adaptive resistance blinders may include forward adaptive resistance blinders (adaptive resistance blinders configured to provide increased resistive coverage in forward load flow conditions), and reverse adaptive resistance blinders (adaptive resistance blinders configured to provide increased resistive coverage in reverse load flow conditions).

Moreover, and like the adaptive reactance elements described above, the resistance module 140 may be configured to generate (in parallel) resistance blinders for phase-to-ground quadrilateral distance modules (phase-to-ground adaptive resistance blinders) and a resistance blinders phase-to-phase quadrilateral distance modules (phase-to-phase adaptive resistance blinders).

Adaptive resistance blinders may be calculated on a per-phase basis; the resistance blinders may include, but are not limited to: A-phase-to-ground adaptive resistance blinders (forward and reverse), B-phase-to-ground adaptive resistance blinders (forward and reverse), C-phase-to-ground adaptive resistance blinders (forward and reverse), A-phase-to-B-phase adaptive resistance blinders (forward and reverse), B-phase-to-C-phase adaptive resistance blinders (forward and reverse), C-phase-to-A-phase adaptive resistance blinders (forward and reverse), and so on. The adaptive resistance blinders may be calculated using respective operating and polarizing quantities, which may be combined using phase comparators, or the like as described above.

The operating quantity for an A-phase-to-ground adaptive resistance blinder (SR1_AG) may be calculated per Equation 6:

$$SR1\_AG=VA-Rset \cdot (IA+k0 \cdot 3I0) \qquad \text{Eq. 6}$$

In Equation 6, VA is an A-phase voltage, IA may correspond to an A-phase current, k0 may be a zero-sequence compensating factor, and I0 may correspond to a zero-sequence current.

The polarizing quantity for forward load flow conditions (e.g., a forward adaptive resistance blinder, or phase-to-ground forward adaptive resistance blinder) may be calculated per Equation 7:

$$SR2\_AGF = IA2 \cdot e^{j\theta L1} \qquad \text{Eq. 7}$$

Equation 7 calculates the forward polarizing quantity for the A-phase-to-ground adaptive resistance blinder, which is denoted SR2_AGF. IA2 is an A-phase negative-sequence current, and θL1 is the angle of the positive-sequence line impedance. Although the polarizing quantity SR2_AGF of Equation 7 uses negative-sequence current, in other embodiments, other polarizing quantities (adapted for forward load flow conditions) could be used, such as a zero-sequence current, or the like (e.g., $SR2\_AGF = IA0 \cdot e^{j\theta L1}$).

Equation 7 may be adapted to calculate forward phase-to-ground adaptive resistance blinders for other phases (e.g., B-phase, C-phase, and so on).

As described above, a separate resistance blinder may be provided that is adapted for reverse load flow conditions. Equation 8 calculates a polarizing quantity for reverse load flow conditions (e.g., a reverse adaptive resistance blinder, or phase-to-ground reverse adaptive resistance blinder). As shown in Equation 8, the reverse load flow polarization quantity (SR2_AGR) uses different sequential components than the polarization quantity of Equation 7:

$$SR2\_AGR = (IA1 + IA2) e^{j\theta L1} \qquad \text{Eq. 8}$$

Equation 8 calculates the reverse polarizing quantity for the A-phase-to-ground adaptive resistance blinder, which is denoted SR2_AGR. The polarizing quantity is derived from a sum of a positive- and negative-sequence components (e.g., IA1+IA2). In alternative embodiments, Equation 8 may use different polarizing quantities, such as a sum of zero- and positive-sequence components, or the like (e.g., $SR2\_AGR = (IA0 + IA1)e^{j\theta L1}$).

As would be recognized by one of skill in the art, Equations 6-8, and/or variations thereof, could be adapted to calculate phase-to-ground adaptive resistance blinders for the B- and/or C-phases (e.g., SR1_BG, SR2_BGF, SR2_BGR, SR1_CG, SR2_CGF, SR2_CFR, and so on).

The polarizing and operating quantities SR1 and SR2 of Equations 6-8 may be combined to calculate an adaptive resistance blinder (e.g., the adaptive reactance blinders 240 described above). The combination may be implemented using various techniques, such as an a phase comparator (e.g., a 90° phase comparator as depicted in FIGS. 3C and 3D), or the like.

In a phase comparator approach, a forward phase-to-ground adaptive resistance blinder (represented as RAG2 to denote the A-phase-to-ground adaptive resistance blinder with negative-sequence polarization) may be calculated per Equation 9 below:

$$RAG2 = \frac{\operatorname{Im}[VA \cdot (IA2 \cdot e^{j\theta L1})^*]}{\operatorname{Im}[(IA + k0 \cdot 3 \cdot I0) \cdot (IA2 \cdot e^{j\theta L1})^*]} \qquad \text{Eq. 9}$$

As discussed above, in alternative embodiments, Equation 9 may be adapted to use different types of sequential components (e.g., zero-sequence, or the like).

A reverse phase-to-ground adaptive resistance blinder may be calculated per Equation 10 (represented as RAGI2 to denote the reverse A-phase-to-ground adaptive resistance blinder with I1+I2 polarization)

$$RAG12 = \frac{\operatorname{Im}[VA \cdot ((IA1 + IA2) \cdot e^{j\theta L1})^*]}{\operatorname{Im}[(IA + k0 \cdot 3 \cdot I0) \cdot ((IA1 + IA2) \cdot e^{j\theta L1})^*]} \qquad \text{Eq. 10}$$

As discussed above, in alternative embodiments, Equation 10 may be adapted to use different types of sequential components (e.g., sum of zero- and positive-sequential components, or the like).

As would be appreciated by one of skill in the art, other variations to Equations 9 and/or 10 could be used to calculate an forward and/or reverse adaptive resistance blinders for other phases (e.g., B-phase, C-phase, etc.), and so on.

An operating quantity for an adaptive phase-to-phase resistance blinder may be calculated per Equation 11 below:

$$SR1\_ABP = (VA - VB) - Rset(IA - IB) \qquad \text{Eq. 11}$$

Equation 11 calculates an operating quantity for a A-phase-to-B-phase adaptive resistance blinder, denoted as SR1_ABP. VA represents an A-phase voltage measurement, VB represents a B-phase voltage measurement, IA is an A-phase current measurement, and IB is a B-phase current measurement. Rset refers to a resistance setting that, as described above, may be derived from properties of the electrical power system and set by testing and/or experience. Equation 11 may be adapted to calculate operating quantities for other phase-to-phase, adaptive resistance blinders (e.g., SR1_BCP, SR1_CAP, and so on).

The operating quantity of Equation 11 may be adapted for forward load flow conditions using a forward polarizing quantity calculated per Equation 12:

$$SR2\_ABPF = (IA2 - IB2) \cdot e^{j\theta L1} \qquad \text{Eq. 12}$$

Equation 12 calculates a forward polarizing quantity for an forward A-phase-to-B-phase adaptive resistance blinder (denoted SR2_ABPF). IA2 is an A-phase negative-sequence current and IB2 is a B-phase negative-sequence current. As described above, Equation 12 adapts the polarizing quantity SR2_ABPF for forward load flow conditions using negative-sequence currents. However, in alternative embodiments, other forward polarizing quantities may be used.

A reverse polarizing quantity (adapted for reverse load flow conditions) may be calculated per Equation 13:

$$SR2\_ABPR = (IA1 - IB1) \cdot e^{j\theta L1} \qquad \text{Eq. 13}$$

Equation 13 calculates a reverse polarizing quantity for a reverse A-phase-to-B-phase adaptive resistance blinder (denoted SR2_ABPR). Equation 13 adapts the polarizing quantity SR2_ABPR for reverse load flow conditions using positive-sequence components. However, in alternative embodiments, other reverse polarizing quantities may be used.

The operating and polarizing quantities of Equations 11 and 12 and/or 13 may be combined to form an adaptive phase resistance blinder; the combination may be implemented using a phase comparator (e.g., a 90° phase comparator as depicted in FIGS. 3C and 3D), or the like, as described above. The phase-to-phase adaptive resistance blinders (forward and reverse) may be calculated on a per-phase basis. The equations for calculating A-phase-to-B-phase operating and/or polarizing quantities described above (Equations 11-13) may be adapted for other phase-to-phase modules (e.g., B-phase-to-C-phase, C-phase-to-A-phase, and so on).

Referring to FIG. 2A, the left resistance blinder (Rleft) 241, may be configured to limit the operation of the quadrilateral distance module for reverse load flow. Accordingly, Rleft 241 may not be adaptive. Rleft 241 may be configured to include small values of resistance (e.g., to ensure satisfactory operation for very reactive lines). However, in alternative embodiments, Rleft 241 may be implemented as an adaptive blinder (e.g., using operating and polarizing quantities as described above). In some embodiments, the left resistance blinder 241 may be calculated using operating and polarizing quantities SRL1 and SRL2, respectively. The operating quantity for a left resistance blinder of an A-phase-to-ground quadrilateral distance module (SRL1_AG) may be calculated per Equation 14:

$$SRL1\_AG = VA + Rleft(IA + k0 \cdot 3 \cdot I0)$$ Eq. 14

In Equation 14, VA is an A-phase voltage measurement, Rleft is a constant (derived from power system properties and set according to testing and/or experience), IA is an A-phase current, and I0 is a zero-sequence current.

The polarizing quantity for a left resistance blinder of an A-phase-to-ground quadrilateral distance module (SRL2_AG) may be calculated per Equation 15:

$$SRL2\_AG = IA + k0 \cdot 3 \cdot I0$$ Eq. 15

The operating and polarizing values SRL1_AG and SRL2_AG may be combined as described above (e.g., using a phase comparator, or the like). Equations 14 and 15 may be adapted to calculate phase-to-ground left resistance blinders for other phases (e.g., B-phase-to-ground, C-phase-to-ground, and so on).

The operating value for a left resistance blinder Rleft 241 for a phase-to-phase quadrilateral distance module may be calculated in a similar manner. An operating quantity for an A-phase-to-B-phase quadrilateral distance module (SRL1_ABP) may be calculated per Equation 16:

$$SRL1\_ABP = (VA - VB) + RLeft(IA - IB)$$ Eq. 16

The polarizing quantity for an A-phase-to-B-phase quadrilateral distance module (SRL2_ABP) may be calculated per Equation 17:

$$SRL2\_ABP = IA - IB$$ Eq. 17

The operating and polarizing values SRL1_ABP and SRL2_ABP may be combined as described above (e.g., using a phase comparator, or the like). Equations 16 and 17 may be adapted to calculate phase-to-phase left resistance blinders for other phases (e.g., B-phase-to-C-phase, C-phase-to-A-phase, and so on).

A directional module (e.g., directional module 150 of FIG. 1) may be configured to determine the direction of a fault and/or configure the quadrilateral distance module to detect faults occurring in the forward direction only. Fault direction (denoted T32Q below) may be determined according to Equation 18:

$$T32Q = |3 \cdot V2| \cdot |3 \cdot I2| \cos[\angle 3 \cdot V2 - (\angle 3 \cdot I2 + \angle Z_{L1})]$$ Eq. 18

Alternatively, the directional element of Equation 18 may be implemented using other symmetrical components, such as zero-sequence components or the like.

The adaptive reactance elements and adaptive resistance blinders described above may be used to implement a quadrilateral distance module (e.g., module 120 of FIG. 1). FIG. 3A is a functional block diagram depicting a quadrilateral distance module 320 implemented within and/or in conjunction with an IED 310.

The quadrilateral distance module 320 receives stimulus 322 from an electrical power system (not shown), such as the power system 100 of FIG. 1. The stimulus 322 may include current phasor measurements, voltage phasor measurements, and the like. The stimulus 322 may comprise measurements of each phase of a three-phase system (e.g. A-phase, B-phase, and/or C-phase current and/or voltage measurements).

The quadrilateral distance module 320 may comprise phase-to-ground quadrilateral distance modules(s) 324 and phase-to-phase quadrilateral distance module(s) 326. The phase-to-ground module(s) 324 and/or the phase-to-phase module(s) 326 may comprise adaptive reactance elements calculated using Equations 1-5 (and/or variations thereof) and adaptive resistance blinders calculated using Equations 6-13 (and/or variations thereof). The modules 324 and/or 326 may further comprise left resistance blinders and/or directional modules implementing Equations 14-18 above.

The phase-to-ground quadrilateral distance module(s) 324 may comprise phase-to-ground modules for each phase of a three-phase system (e.g., A-phase-to-ground, B-phase-to-ground, C-phase-to-ground, and so on). Outputs of the separate, parallel modules 324 may be combined (using OR logic or the like, not shown) into an output 325. The output 325 may assert if any one of the phase-to-ground module(s) 324 detects a fault condition.

The phase-to-phase quadrilateral distance module(s) 326 may comprise a phase-to-phase module for each phase of a three-phase system (e.g., A-phase-to-B-phase, B-phase-to-C-phase, C-phase-to-A-phase, and so on). Outputs of the separate, parallel modules 326 may be combined (using OR logic or the like, not shown) into an output 327. The output 327 may assert if any one of the phase-to-phase module(s) 326 detects a fault condition.

The outputs 325 and 327 of the phase-to-ground quadrilateral distance module(s) 324 and the phase-to-phase quadrilateral distance module(s) 326 may be combined (using OR logic 328) into the quadrilateral distance module output 329.

FIG. 3B is a functional block diagram depicting a quadrilateral distance module 320 implemented within and/or in conjunction with an IED 310. The adaptive resistance blinders described above may be adapted for forward and/or reverse load flow conditions. In the FIG. 3B example, the quadrilateral distance module 320 comprises parallel phase-to-ground quadrilateral distance modules 324A and 324B; the module(s) 324A may include forward resistance blinders (e.g., implemented using negative-sequence polarization, or the like), and the module(s) 324B may include reverse resistance blinders (e.g., implementing I1+I2 polarization, or the like). The module 320 may further comprise parallel phase-to-phase quadrilateral distance module(s) 326A and 326B; the module(s) 326A may include forward resistance blinders (e.g., implementing negative-sequence polarization, or the like), and the module(s) 326B may include reverse resistance blinders (e.g., implementing positive-sequence polarization, I1+I2 polarization, or the like). The outputs of the parallel modules 324A and 324B and 326A and 326B may be combined (using OR logic or the like), to generate the outputs 325 and 327.

FIG. 3C is a functional block diagram of one embodiment of a phase-to-ground quadrilateral distance module(s) 324. As shown in FIG. 3C, the phase-to-ground quadrilateral distance module(s) 324 may be implemented as a set of separate logic modules for each phase (Quad_AG, Quad_BG, Quad_CG, and so on) and/or may be implemented using a single module (and/or set of logic modules) (not shown).

Although FIG. 3C depicts the implementation details for a single phase-to-ground module (A-phase-to-ground), other phase-to-ground modules (Quad_BG and/or Quad_CG) could be implemented using similar components (e.g., comparators 360, 362, 364, and/or 366), and/or directional module 368.

The 90° phase comparator 360 may implement a phase-to-ground adaptive reactance element (using power system stimulus 322). Accordingly, the comparator 360 may compare an adaptive reactance A-phase-to-ground operating quantity SX1_AG (e.g., calculated per Equation 1, or a variant thereof), with a polarizing quantity SX2_AG (e.g., calculated per Equation 3, or a variation thereof). The polarizing quantity may be selected according to a polarization selection signal (XPOL). If negative-sequence polarization is to be used (as indicated by XPOL), SX2_AG may use negative-sequence stimulus components (e.g. negative-sequence currents as shown in Equation 3), alternatively, SX2_AG may be calculated using a zero-sequence currents. An output of the comparator 360 may flow to AND logic 370 (or an equivalent) to be combined with the output of the other comparators 362, 364, 366, and/or the directional module 368. The output of the comparator 360 may assert when the stimulus 322 satisfies the adaptive reactance element of the comparator 360.

The 90° phase comparator 362 may implement a forward A-phase-to-ground adaptive resistance blinder. Accordingly, the comparator 362 may compare an A-phase-to-ground adaptive resistance operating quantity SR1_AG (e.g., calculated per Equation 6, or a variant thereof) with a forward A-phase-to-ground adaptive polarizing quantity SR2_AGF (e.g., calculated per Equation 7, or a variant thereof). The polarizing quantity may be selected according to XPOL. If negative-sequence polarization is used (as indicated by XPOL), SR2_AGF may be calculated per Equation 7; otherwise a variant (using zero-sequence components) may be used. The output of the comparator 362 may assert when the stimulus 322 satisfies the forward A-phase-to-ground adaptive resistance blinder of comparator 362.

The 90° phase comparator 364 may implement a reverse A-phase-to-ground adaptive resistance blinder. Accordingly, the comparator 364 may compare the A-phase-to-ground adaptive resistance operating quantity SR1_AG (e.g., calculated per Equation 6, or a variation thereof) with a reverse A-phase-to-ground adaptive polarizing quantity SR2_AGR (e.g., calculated per Equation 8, or a variant thereof). SR2_AGR may be derived from a sum of positive- and negative-sequential components and/or a sum of positive- and negative-sequential components (e.g., as indicated by XPOL). The output of the comparator 364 may assert when the stimulus 322 satisfies the reverse A-phase-to-ground adaptive resistance blinder of comparator 364.

Outputs of the 90° phase comparators 362 and 364 may be combined using OR logic 363 (or an equivalent). Accordingly, the module 324 may be configured to detect faults occurring under either forward load flow or reverse load flow conditions (in parallel).

The 90° phase comparator 366 may implement an A-phase-to-ground left resistance blinder (e.g., Rleft 241). Accordingly, the comparator 364 may compare an A-phase-to-ground left resistance operating quantity SRL1_AG (e.g., calculated per Equation 14, or a variant thereof), with an A-phase-to-ground left resistance polarizing quantity SRL2_AG (e.g., calculated per Equation 15, or variant thereof). The output of the comparator 366 may assert when the stimulus 322 satisfies the left resistance blinder of comparator 366.

In some embodiments, the module 324 may include a directional module 368 to determine fault direction using negative (e.g., per Equation 18). The directional module 368 may be configured to cause the module 324 to only detect faults occurring in the forward direction, and to suppress operation for faults occurring behind the module 324.

The outputs of the comparators 360, 362, 364, and 366, and the directional module 368 may be combined by AND logic 370 (or an equivalent), the output of which may comprise an A-phase-to-ground quadrilateral distance module output (Quad_AG). The Quad_AG output may be combined with a B-phase-to-ground quadrilateral distance module output (Quad_BG) and a C-phase-to-ground quadrilateral distance module output (Quad_CG) using OR logic 372 (or an equivalent) to form the phase-to-ground quadrilateral distance module output 325.

FIG. 3D is a functional block diagram of one embodiment of a phase-to-phase quadrilateral distance module 326. As shown in FIG. 3D, the phase-to-phase quadrilateral distance module(s) 326 may be implemented as a set of separate logic modules for each phase (Quad_AB, Quad_BC, Quad_CA, and so on) and/or may be implemented using a single module (and/or set of logic) (not shown).

Although FIG. 3D depicts implementation details for an A-phase-to-B-phase quadrilateral distance module, other phase-to-phase modules (Quad_BC and/or Quad_CA) could be implemented by adapting the A-phase-to-B-phase modules depicted in FIG. 3D (e.g., comparators 380, 382, 384, and/or 386), and/or directional module 388.

The 90° phase comparator 380 may implement a phase-to-phase adaptive reactance element (using the stimulus 322 obtained from the electrical power system). Accordingly, the comparator 380 may compare an adaptive reactance A-phase-to-B-phase operating quantity SX1_ABP (e.g., calculated per Equation 4, or a variant thereof), with a corresponding polarizing quantity SX2_ABP (e.g., calculated per Equation 5, or a variant thereof). The output of the comparator 380 may assert when the stimulus 322 satisfies the adaptive reactance element of comparator 380.

The output of the comparator 380 may flow to AND logic 390 (or an equivalent) to be combined with the outputs of the other comparators 382, 384, 386, and/or the directional module 388.

The 90° phase comparator 382 may implement a forward A-phase-to-B-phase adaptive resistance blinder. Accordingly, the comparator 382 may compare an A-phase-to-B-phase adaptive resistance operating quantity SR1_ABP (e.g., calculated per Equation 11, or a variant thereof) with a forward A-phase-to-B-phase polarizing quantity SR2_ABPF (e.g., calculated per Equation 12 using negative-sequence components, or a variant thereof). The output of the comparator 382 may assert when the stimulus 322 satisfies the forward adaptive resistance blinder of comparator 382.

The 90° phase comparator 384 may implement a reverse A-phase-to-B-phase adaptive resistance blinder. Accordingly, the comparator 384 may compare the A-phase-to-B-phase adaptive resistance operating quantity SR1_ABP (e.g., calculated per Equation 11, or a variant thereof) with a reverse A-phase-to-B-phase polarizing quantity SR2_ABPR (e.g., calculated per Equation 13, using positive-sequence components, or a variant thereof). The output of the comparator 384 may assert when the stimulus 322 satisfies the reverse adaptive resistance blinder of comparator 384.

Outputs of the 90° phase comparators 382 and 384 may be combined using OR logic 383 (or an equivalent). Accordingly, the module 326 may be configured to detect faults occurring in either forward load flow or reverse load flow conditions (in parallel).

The 90° phase comparator 386 may implement an A-phase-to-B-phase left resistance blinder. Accordingly, the comparator 386 may compare an A-phase-to-B-phase left resistance operating quantity SRL1_ABP (e.g., calculated per Equation 16, or a variant thereof), with an A-phase-to-B- phase left resistance polarizing quantity SRL2_ABP (e.g., calculated per Equation 17, or a variant thereof). The output of the comparator 386 may assert when the stimulus 322 satisfies the left resistance blinder of comparator 386.

In some embodiments, the module 326 may comprise a directional module 388 to determine the fault direction using negative-sequence measurements (e.g., per Equation 18 above). The directional module 388 may be configured to cause the module 326 to only detect faults occurring in the forward direction and to suppress operation for faults occurring behind the module 326.

The outputs of the comparators 380, 382, 384, and 386, and the directional module 388 may be combined by AND logic 390 (or an equivalent), the output of which may comprise an A-phase-to-B-phase quadrilateral distance module output (Quad_AB). The Quad_AB output may be combined with a B-phase-to-C-phase quadrilateral distance module output (Quad_BC) and a C-phase-to-A-phase quadrilateral distance module output (Quad_CA) using OR logic 392 (or an equivalent) to form the phase-to-phase quadrilateral distance module output 327.

Figure 4:
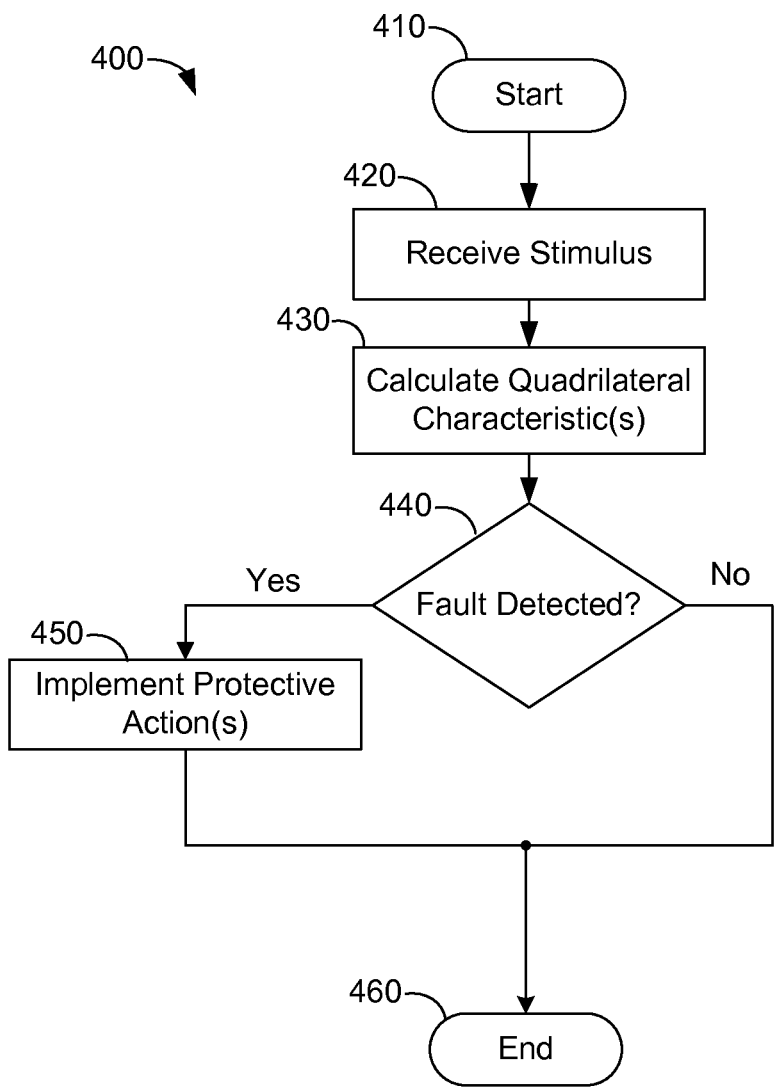
FIG. 4 is a flow diagram of one embodiment of a method for protecting an electrical power system using a quadrilateral distance module comprising an adaptive resistance blinder.

FIG. 4 is a flow diagram of one embodiment of a method 400 for protecting and/or monitoring an electrical power system using an adaptive quadrilateral characteristic comprising an adaptive resistance blinder. At step 410, the method 400 may start and be initialized. Step 410 may comprise loading one or more machine-readable instructions from a storage medium, initializing machine resources, and the like.

At step 420, stimulus from the electrical power system may be received. The stimulus may comprise current and/or voltage measurements obtained from the electrical power system using one or more measurement devices, such as current transformers, voltage measurement devices, or the like. The stimulus inputs of step 420 may comprise phasor measurements, measurements of each phase of a three-phase signal, or the like.

At step 430, the stimulus may be used to generate an adaptive quadrilateral characteristic. Accordingly, step 430 may comprise calculating phase-to-ground adaptive reactance elements and/or phase-to-phase adaptive reactance elements. The quadrilateral characteristics(s) calculated at step 430 may include an adaptive resistance blinder. Accordingly, step 430 may comprise calculating one or more adaptive phase-to-ground and/or phase-to-phase resistance blinders. Step 430 may further comprise calculating one or more forward adaptive resistance blinders (adaptive resistance blinders configured for forward load flow conditions) in parallel with one or more reverse adaptive resistance blinders (adaptive resistance blinders configured for reverse load flow conditions). Outputs of quadrilateral distance modules comprising the forward and/or reverse adaptive resistance blinders may be combined in an OR operation (or logical equivalent) as depicted in FIGS. 3C and 3D.

Also in step 430, the method 400 may determine if a fault has occurred using the quadrilateral characteristic(s) comprising respective adaptive resistance blinders. Step 430 may comprise implementing one or more comparators (e.g., 90° phase comparators of FIGS. 3C and 3D). Step 430 may further comprise evaluating one or more directional modules (directional module 368 and/or directional module 388) and to suppress operation if the directional module(s) indicate that the fault did not occur in a forward direction with respect to the method 400.

If at step 440, a fault is detected (one or more of the phase-to-ground and/or phase-to-phase quadrilateral distance modules detects a fault condition), the flow may continue to step 450; otherwise, the flow may continue to step 460.

At step 450, the method 400 may implement one or more protective and/or monitoring functions which may include, but are not limited to: tripping one or more breakers, operating one or more switches, asserting one or more alarms, issuing one or more notifications, or the like.

At step 460, the method 400 may terminate until a next set of stimulus is received, at which point the flow may continue at step 420.

In some embodiments, the quadrilateral distance modules described herein may be configured to respond more quickly to fault conditions using a dual-filter technique, in which the quadrilateral distance module is implemented twice (per cycle), using two different filter outputs: a first implementation using full-cycle filtered stimulus; and a second implementation using half-cycle filtered stimulus. The results of both implementations may be combined in a logical OR operation.

The adaptive resistance blinders described above may be implemented using stimulus out of different filters, such as, for example, one cycle window cosine filter, half cycle window cosine filter, one-cycle Fourier filter, half-cycle Fourier filter, etc. The use of multiple filters (e.g., half-cycle along with full-cycle) may enable high-speed, half-cycle operation. For example, an A-phase-to-ground adaptive resistance blinder may be implemented using half-cycle Fourier filters per the Equations below:

$$rAG2H = \frac{Imag[VAH \cdot (IA2H \cdot e^{j \cdot (Z1ANG)})^*]}{Imag[(IALH + k01 * IGLH) \cdot (IA2H \cdot e^{j \cdot (Z1ANG)})^*]} \quad \text{Eq. 19}$$

$$rAG12H = \frac{Imag[VAH \cdot ((IA1H + IA2H) \cdot e^{j \cdot (Z1ANG)})^*]}{Imag[(IALH + k01 * IGLH) \cdot ((IA1H + IA2H) \cdot e^{j \cdot (Z1ANG)})^*]} \quad \text{Eq. 20}$$

Equations 19 and 20 may be adapted to calculate phase-to-ground adaptive resistance blinders for other phases (e.g., B-phase-to-ground, C-phase-to-ground, and so on).

Equations 21 and 22 may be used to calculate an A-phase-to-B-phase adaptive resistance blinder using half-cycle Fourier filters:

$$rABR1H = \frac{imag((VABH) \cdot \{IAB1LH \cdot e^{jZ1ANG}\}^*)}{imag((IABLH) \cdot \{IAB1LH \cdot e^{jZ1ANG}\}^*)} \quad \text{Eq. 21}$$

$$rABR2H = \frac{imag((VABH) \cdot \{IAB2LH \cdot e^{jZ1ANG}\}^*)}{imag((IABLH) \cdot \{IAB2LH \cdot e^{jZ1ANG}\}^*)} \quad \text{Eq. 22}$$

Equations 21 and 22 may be adapted to calculate half-cycle phase-to-ground adaptive resistance blinders for other phases (e.g., B-phase-to-ground, C-phase-to-ground, and so on).

In some embodiments (e.g., single-pole tripping applications), adapting the phase-to-ground quadrilateral distance modules described above may include supervising the modules (Quad_AG, Quad_BG, and/or Quad_CG of FIG. 3C) using a faulted phase selection function. Accordingly, the quadrilateral distance modules described above may be modified to include a high-speed directional and fault type selection (HSD-FTS) function. The HSD-FTS function may comprise calculating three incremental torques to identify faulted phases and/or fault direction:

$$\Delta TAB = Re[\Delta VAB \cdot (1\angle\theta_{L1} \cdot \Delta IAB)^*]$$

$$\Delta TBC = Re[\Delta VBC \cdot (1\angle\theta_{L1} \cdot \Delta IBC)^*]$$

$$\Delta TCA = Re[\Delta VCA \cdot (1\angle\theta_{L1} \cdot \Delta ICA)^*] \qquad \text{Eq. 23}$$

In Equation 23, $\Delta VAB$ represents a two-cycle window incremental A-phase-to-B-phase voltage and $\Delta IAB$ represents a two-cycle window incremental A-phase-to-B-phase current.

The signs of the torques of Equation 23 may be used to establish fault direction and/or the identify the fault type, from which the following directional signals may be determined:

TABLE 1

| Signal | Fault Description |
| --- | --- |
| HSD-AGF, HSD-AGR | Forward, reverse A-phase to Gnd |
| HSD-BGF, HSD-BGR | Forward, reverse B-phase to Gnd |
| HSD-CGF, HSD-CGR | Forward, reverse C-phase to G |
| HSD-ABF, HSD-ABR | Forward, reverse A-phase to B-phase |
| HSD-BCF, HSD-BCR | Forward, reverse B-phase to C-phase |
| HSD-CAF, HSD-CAR | Forward, reverse C-phase to A-phase |
| HSD-ABCF, HSD-ABCR | Forward, reverse A-phase to B-phase to C-phase |

The HSD-FTS signals disclosed above may be derived from incremental current and/or voltage stimulus, and as such, may be available for only two cycles following the inception of a fault. Accordingly, the high-speed quadrilateral distance module signals derived from the HSD-FTS signals may be available within the same time interval.

For a reactance module (e.g., reactance module 130 of FIG. 1), the high-speed implementation of a phase-to-ground quadrilateral characteristic may use the same polarizing quantities as its conventional counterpart (e.g., negative- or zero-sequence polarizing quantities as described above). During a pole open, however, the polarization quantities may be adapted to use an incremental impedance loop current (as the polarizing quantity) so that the phase-to-ground implementation remains operational for single-pole tripping applications.

For high-speed implementations of a phase-to-phase quadrilateral distance module, the polarization quantities may be modified to use the loop-impedance incremental current to ensure coverage for phase faults and/or single-pole tripping applications.

The resistance module (e.g., module 140) may operate as described above in conjunction with Equations 6-13, and as such, the steady-state resistance coverage may remain unchanged as compared to the conventional (non-high-speed) embodiments described above.

Figure 5:
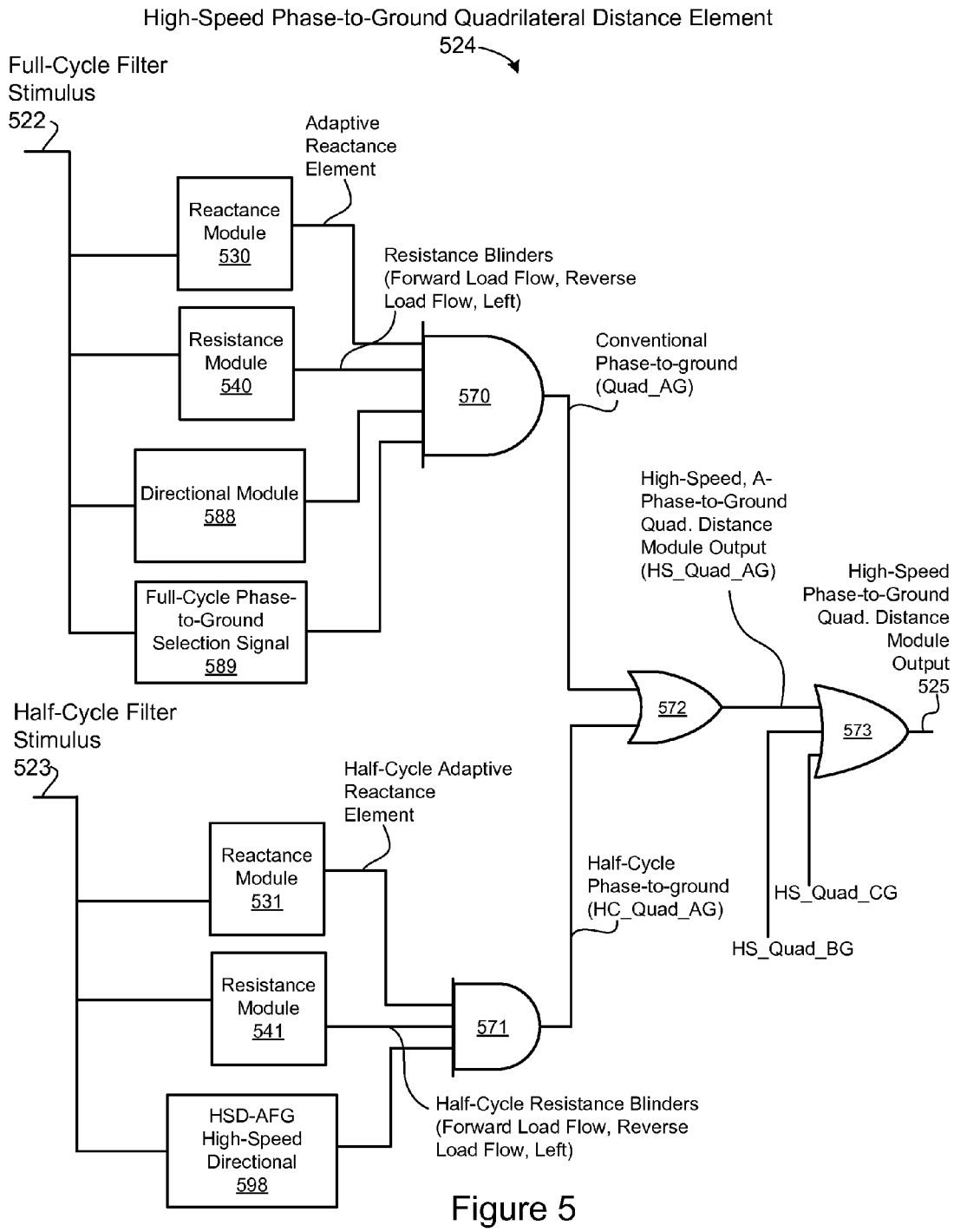
FIG. 5 is a functional block diagram of one embodiment of a high-speed, phase-to-ground quadrilateral distance module.

FIG. 5 depicts one embodiment of a high-speed A-phase-to-ground quadrilateral distance module 524 configured to generate a high-speed, phase-to-ground quadrilateral distance module output 525. The module 524 may include a full-cycle filter module (comprising modules 530, 540, 588, and 589), and a half-cycle filter module (comprising modules 531, 541, and 598).

A reactance module 530 may receive full-cycle filter stimulus 522 (obtained from an electrical power system, not shown) and may implement an adaptive reactance element (e.g., using a 90° phase comparator, such as the comparator 360 of FIG. 3C). The resistance module 540 may implement adaptive resistance blinders including, but not limited to, an forward adaptive resistance blinder (e.g., using a 90° phase comparator, such as the comparator 362 of FIG. 3C), a reverse adaptive resistance blinder (e.g., using a 90° phase comparator, such as the comparator 364 of FIG. 3C), and/or a left resistance blinder (e.g., using a 90° phase comparator, such as the comparator 366 of FIG. 3C). In some embodiments, the forward and reverse resistance blinders may be combined using OR logic (or an equivalent) as in FIG. 3C. The directional module 588 may determine fault direction using the full-filter stimulus 522 (as described above). A full-cycle phase-to-ground selection signal 598 may be generated as described above. The outputs of the modules 530, 540, 588, and 589 may flow to AND logic 570 (or an equivalent), which may form a conventional, A-phase-to-ground quadrilateral distance module output (Quad_AG).

The half-cycle modules 531, 541, and 598 may generate a high-speed, A-phase-to-ground quadrilateral distance module output (HC_Quad_AG) using the half-cycle filter stimulus 523. The reactance module 531 may implement an adaptive phase-to-ground reactance element using half-cycle filter stimulus 523 (e.g., and using a comparator as described above). The resistance module 541 may generate a forward adaptive resistance blinder, reverse adaptive resistance blinder, and/or a left resistance blinder using the stimulus 523 (e.g., using one or more comparators as described above). The HSD_AFG directional module 598 may generate a directional output (fault direction) using the half-cycle filter stimulus 523. The outputs of the modules 531, 541, and 598 may flow to AND logic 571 (or an equivalent), which may form a half-cycle, A-phase-to-ground quadrilateral distance module output (HC_Quad_AG).

The Quad_AG and HC_Quad_AG outputs may be combined using OR logic 572 (or an equivalent) to generate a high-speed, A-phase-to-ground quadrilateral distance module output HS_Quad_AG. The HS_Quad_AG output may be combined with the B- and C-phase-to-ground high-speed quadrilateral distance module outputs (e.g., using OR logic 573 or an equivalent) to form a high-speed quadrilateral distance module phase-to-ground output 525.

As would be recognized by one of skill in the art, the modules depicted in FIG. 5 may be adapted to generate high-speed quadrilateral distance module outputs for a B-phase-to-ground quadrilateral distance module output (HS_Quad_BG) and/or a C-phase-to-ground quadrilateral distance module output (HS_Quad_CG). FIG. 5 may be further adapted to implement a high-speed phase-to-phase quadrilateral distance module (similar to the module 326 described above in conjunction with FIG. 3D).

Reference throughout this specification to "some embodiments" or an "embodiment" means that a particular feature, structure, or characteristic described in connection with the embodiment is included in at least one embodiment. Thus, the appearance of the phrases "in one embodiment" or "in some embodiments" in various places throughout this specification are not necessarily all referring to the same embodiment. Furthermore, an "embodiment" may be a system, a device, an article of manufacture, a method, and/or a process.

The phrases "connected to," "networked," and "in communication with" "communicatively coupled to" refer to any form of interaction between two or more entities, including mechanical, electrical, magnetic, and electromagnetic interactions. Two components may be connected to each other even though they are not in direct physical contact with each other and even though there may be intermediary devices between the two components.

Some of the infrastructure that can be used with embodiments disclosed herein is already available, such as: general-purpose processors, programming tools and techniques, non-transitory, computer- and/or machine-readable storage media, and communications networks and interfaces. A computing device, such as an IED and/or monitoring device, may include a processor, such as a microprocessor, microcontroller, logic circuitry, or the like. The processor may include a special purpose processing device, such as an ASIC, PAL, PLA, PLD, FPGA, or other processing means. The computing device may also include a machine-readable storage medium such as non-volatile memory, static RAM, dynamic RAM, ROM, CD-ROM, disk, tape, magnetic, optical, flash memory, or other non-transitory machine-readable storage medium.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A non-transitory machine-readable storage medium comprising instructions to perform a method for detecting faults in an electrical power system, the method comprising:
    receiving stimulus from an electrical power system;
    calculating an adaptive resistance blinder using the stimulus, the adaptive resistance blinder adapted using a polarizing quantity derived from sequential components of the stimulus; and
    detecting a fault in the electrical power system when the stimulus satisfy the adaptive resistance blinder.

2. The non-transitory machine-readable storage medium of claim 1, the method further comprising:
    calculating a quadrilateral characteristic comprising an adaptive reactance element and the adaptive resistance blinder; and
    detecting a fault in the electrical power system when the stimulus satisfy the quadrilateral characteristic.

3. The non-transitory machine-readable storage medium of claim 1, wherein the polarizing quantity is to increase a resistive coverage of the adaptive resistance blinder in forward load flow conditions.

4. The non-transitory machine-readable storage medium of claim 3, wherein the polarizing quantity comprises one of negative-sequence polarization and zero-sequence polarization.

5. The non-transitory machine-readable storage medium of claim 1, wherein the polarizing quantity is to increase a resistive coverage of the adaptive resistance blinder in reverse load flow conditions.

6. The non-transitory machine-readable storage medium of claim 5, wherein the polarizing quantity comprises one of a polarizing quantify derived from a sum of positive- and negative-sequence components and a positive-sequence component.

7. The non-transitory machine-readable storage medium of claim 1, wherein calculating the adaptive resistance blinder comprises calculating a forward adaptive resistance blinder adapted for forward load flow conditions and a reverse resistance blinder adapted for reverse load flow conditions, and wherein a fault is detected in the electrical power system when the stimulus satisfy one of the forward adaptive resistance blinder and the reverse adaptive resistance blinder.

8. The non-transitory machine-readable storage medium of claim 1, wherein the calculating the adaptive resistance blinder comprises, calculating a phase-to-ground adaptive resistance blinder, and calculating a phase-to-phase adaptive resistance blinder, wherein a fault is detected in the electrical power system when the stimulus satisfy one of the phase-to-ground adaptive resistance blinder and the phase-to-phase adaptive resistance blinder.

9. The non-transitory machine-readable storage medium of claim 1, wherein calculating the adaptive resistance blinder comprises,
    calculating a forward phase-to-ground adaptive resistance blinder adapted for forward load flow conditions and a reverse phase-to-ground adaptive resistance blinder adapted for reverse load flow conditions, and
    calculating a reverse phase-to-phase adaptive resistance blinder adapted for forward load flow conditions and a reverse phase-to-ground adaptive resistance blinder adapted for reverse load flow conditions,
    wherein a fault is detected in the electrical power system when the stimulus satisfy one of the forward phase-to-ground adaptive resistance blinder, the reverse phase-to-ground adaptive resistance blinder, the forward, phase-to-phase adaptive resistance blinder, and the reverse phase-to-phase adaptive resistance blinder.

10. The non-transitory machine-readable storage medium of claim 9, wherein the reverse phase-to-ground adaptive resistance blinder is adapted using a polarizing quantity derived from a sum of a positive- and negative-sequence components of the stimulus and wherein the reverse phase-to-phase adaptive resistance blinder is adapted using a positive-sequence component of the stimulus.

11. A method for detecting faults in an electrical power system, comprising:
    receiving at an Intelligent Electronic Device (IED), stimulus obtained using measurement devices in electrical communication with an electrical power system;
    calculating an adaptive resistance blinder using the stimulus, the adaptive resistance blinder comprising a polarization quantity derived from a sequential component of the stimulus;
    detecting a fault in the electrical power system when the stimulus satisfy the adaptive resistance blinder.

12. The method of claim 11, wherein calculating the adaptive resistance blinder
    comprises, calculating a forward adaptive resistance blinder adapted for forward load flow conditions and a reverse adaptive resistance blinder adapted for reverse load flow conditions, the method further comprising:
    defining a quadrilateral distance module comprising an adaptive reactance element, the forward adaptive resistance blinder, and the reverse adaptive resistance blinder,
    wherein a fault in the electrical power system is detected when the stimulus satisfy the adaptive reactance element and one of the forward adaptive resistance blinder and the reverse adaptive resistance blinder.

13. The method of claim 12, wherein the forward resistance blinder comprises one of negative-sequence polarization and zero-sequence polarization, and wherein the reverse resistance blinder comprises one of a polarizing quantity derived from a sum of a positive- and negative sequence components of the stimulus, and positive-sequence polarization.

14. The method of claim 12, wherein the forward adaptive resistance blinder comprises a phase-to-ground forward adaptive resistance blinder and a phase-to-phase forward adaptive resistance blinder, and the reverse adaptive resistance blinder.

* * * * *